(12) United States Patent
Huang et al.

(10) Patent No.: US 9,703,106 B2
(45) Date of Patent: Jul. 11, 2017

(54) PARALLAX BARRIER, DESIGNING METHOD THEREOF AND PARALLAX BARRIER TYPE 3D DISPLAY DEVICE

(71) Applicants: BOE Technology Group Co., Ltd., Beijing (CN); Chengdu BOE Optoelectronics Technology Co., Ltd., Chengdu (CN)

(72) Inventors: Xiaomei Huang, Beijing (CN); Fan Li, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 128 days.

(21) Appl. No.: 14/054,202

(22) Filed: Oct. 15, 2013

(65) Prior Publication Data

US 2014/0104683 A1    Apr. 17, 2014

(30) Foreign Application Priority Data

Oct. 15, 2012  (CN) .......................... 2012 1 0390243

(51) Int. Cl.
G02B 27/22    (2006.01)
G06F 17/50    (2006.01)
H04N 13/04    (2006.01)

(52) U.S. Cl.
CPC ......... *G02B 27/2214* (2013.01); *G06F 17/50* (2013.01); *H04N 13/0409* (2013.01)

(58) Field of Classification Search
CPC .. G02B 5/18; G02B 27/2214; G02B 27/2228; G02B 27/22; G02B 5/1842;

(Continued)

(56) References Cited

U.S. PATENT DOCUMENTS 6,040,807 A * 3/2000 Hamagishi et al. .............. 345/6
2009/0080099 A1  3/2009 Tanimoto et al.

FOREIGN PATENT DOCUMENTS

CN    101228568 A    7/2008
CN    202815255 U    3/2013

OTHER PUBLICATIONS

Second Office Action (Chinese language) issued by the Chinese Patent Office for Chinese Patent Application No. CN201210390243. 1, issued on Feb. 15, 2015; 3 pages.

(Continued)

*Primary Examiner* — Scott J Sugarman
*Assistant Examiner* — Balram Parbadia
(74) *Attorney, Agent, or Firm* — Banner & Witcoff, Ltd.

(57) ABSTRACT

Embodiments of the present invention disclose a parallax barrier, a designing method thereof and a parallax barrier type 3D display device. The parallax barrier comprises: a plurality of grating sheets, utilized to shield light, disposed in an arrangement direction and spaced apart from each other, wherein the plurality of grating sheets are divided into 2K identical grating sections each of which comprises two or more grating segments, each grating segment comprises one or more grating sheets with an identical grating pitch C, and the grating sheets included in different grating segments have different grating pitches, and the 2K grating sections are arranged symmetrically about a center line of the parallax barrier in the arrangement direction, and K is a natural number.

12 Claims, 2 Drawing Sheets

(58) Field of Classification Search
CPC ........... H04N 13/0497; H04N 13/0409; H04N 13/0402; H04N 13/0413; H04N 13/0415
See application file for complete search history.

(56) References Cited

OTHER PUBLICATIONS

English translation of Second Office Action issued by the Chinese Patent Office for Chinese Patent Application No. CN201210390243.1, issued on Feb. 15, 2015; 1 page.
Extended European Search Report in corresponding European Patent No. EP13155433.3, issued Jan. 3, 2014; 10 pages.
First Office Action issued by the State Intellectual Property Office of the People's Republic of China for Chinese Patent Application No. 201210390243.1 issued Jul. 2, 2014, 9pgs.
English translation of First Office Action issued by the State Intellectual Property Office of the People's Republic of China for Chinese Patent Application No. 201210390243.1 issued Jul. 2, 2014, 10pgs.
Feb. 2, 2016—(EP) Office Action—App 13188733.3.
Nov. 24, 2016—(EP) Second European Office Action Appn No. 13188733.3.

\* cited by examiner

PARALLAX BARRIER, DESIGNING METHOD THEREOF AND PARALLAX BARRIER TYPE 3D DISPLAY DEVICE

CROSS REFERENCE TO RELATED APPLICATIONS

This application claims priority from Chinese National Application No. 201210390243.1 filed on Oct. 15, 2012, the contents of which are incorporated herein by reference.

TECHNICAL FIELD

Embodiments of the present invention relate to a parallax barrier, a designing method thereof and a parallax barrier type 3D display device.

BACKGROUND

In a parallax barrier type 3D display device, pixels of a display panel alternately display a left eye image and a right eye image by columns, and by arranging a parallax barrier parallel to the display panel in front of the display panel or between the display panel and a backlight source and using a light-shielding effect of a grating sheet of the parallax barrier, a left eye of a viewer and a right eye respectively see the left eye image and the right eye image displayed in the pixels of the display panel, and thus, the stereoscopy can be achieved without wearing a stereoscopic glasses, wherein, the grating sheet is a black stripe having the light-shielding effect in the parallax barrier. In addition, isolation pixels can be arranged between the pixels displaying the left eye image and the pixels displaying the right eye image to prevent dizzy phenomenon.

The theoretical value $C_{theory}$ of a grating pitch is a parameter value theoretically calculated according to the structure model of the parallax barrier, and the $C_{theory}$ has different theoretical derivation formulas depending on uses of the parallax barrier, for example, the theoretical derivation formula of a two-viewpoint rear parallax barrier 3D display device is different from that of a two-viewpoint front parallax barrier 3D display device. FIG. 1 is a principle view of the light path of a current two-viewpoint rear parallax barrier 3D display device, and the 3D display device comprises a display panel 100 and a parallax barrier 200 parallel to it. For the parallax barrier type 3D display device, in order to achieve the stereoscopic display, it is necessary to shield a part of light from a light source by grating sheets 210 of the parallax barrier after the parallax barrier is arranged, so that the left eye of a viewer can only see the pixels 110 displaying the left eye image and the right eye of the viewer can only see the pixels 120 displaying the right eye image. In other words, in order to achieve the stereoscopic display, the parallax barrier should be aligned with the display panel accurately, so that the left eye of the viewer can only see the pixels of the left eye image and the right eye of the viewer can only see the pixels of the right eye image; on the contrary, if the parallax barrier is not aligned with the display panel accurately, the left eye of the viewer cannot see the pixels of the left eye image and the right eye of the viewer cannot see the pixels of the right eye image, thus the stereoscopic display cannot be achieved.

Exemplarily, in order to achieve the accurate alignment between the parallax barrier and the display panel, parameter design formulas of the parallax barrier of the two-viewpoint rear parallax barrier 3D display device is illustrated as follow: $h=p \times s \div (l-p)$, and $C_{theory}=2 \times p \times l \div (l-p)$, wherein, s is the best viewing distance, l is a distance between two eyes, and h is a placing height of the parallax barrier, and the placing height of the parallax barrier is a distance between the parallax barrier and a surface facing the parallax barrier of the display panel, p is a pixel length of the display panel in an arrangement direction of the grating sheets of the parallax barrier, $C_{theory}$ is a theoretical value of a grating pitch which is a pitch between two adjacent grating sheets. Thus, by using the parameter design formulas of the parallax barrier, the theoretical value of the grating pitch $C_{theory}$ when the parallax barrier is accurately aligned with the display panel can be calculated.

From the parameter design formulas of the parallax barrier, the theoretical value of the grating pitch $C_{theory}$ is relevant to the length pixel p of the display panel and is slightly larger than twice of the length pixel p. Under the influence of a practical fabrication accuracy, an actual value of a grating pitch $C_{actual}$ is different in some way from the theoretical value of the grating pitch $C_{theory}$. For example, the practical fabrication process is usually designed by taking 0.00025 mm or 0.0005 mm as a minimum accuracy. Considering the fabrication accuracy, the actual value of the grating pitch of a conventional parallax barrier only satisfies a relationship of $C_{actual}=2p+$practical fabrication accuracy of a parallax barrier, then $$C_{actual} - C_{theory} = 2p + \text{practical fabrication accuracy of a}$$
$$\text{parallax barrier} - 2 \times p \times l \div (l-p)$$
$$= \text{practical fabrication accuracy of a}$$
$$\text{parallax barrier} - 2p \times (l \div (l-p) - 1)$$
$$= \text{practical fabrication accuracy of a parallax barrier} -$$
$$2 \times p \times p \div (l-p).$$

It can be known from the above that an error between $C_{actual}$ and $C_{theory}$ is relevant to the fabrication accuracy of the parallax barrier, p and l. There is such error between each actual value of the grating pitch $C_{actual}$ and the theoretical value $C_{theory}$ of the grating pitch, and the error is a positive number or a negative number, Y is defined to be a alignment error of the parallax barrier, then Y=practical fabrication accuracy of a parallax barrier$-2 \times p \times p \div (l-p)$, and the more the number of the grating sheets of the parallax barrier is, the larger the alignment error Y at two edges of the parallax barrier is.

For example, for a 4-inch parallax barrier type 3D display device, the pixel length p of the display panel in a length direction of the display panel, i.e., the arrangement direction of the grating sheets of the parallax barrier, is 0.111 mm, the best viewing distance s is 300 mm, the distance l between two eyes is 65 mm, according to the formulas of $h=p \times s \div (l-p)$ and $C_{theory}=2 \times p \times l \div (l-p)$, and taking the practical fabrication accuracy of 0.0005 mm as an example, it can be obtained that the alignment error Y≈0.00012 mm.

As shown in FIG. 2, the grating pitches of the conventional parallax barrier are the same. Suppose that there are 400 grating sheets included in the current parallax barrier in the length direction of the display panel, and the current parallax barrier is usually aligned with the display panel at a central position of a horizontal direction, an alignment error between a pixel of the display panel at the central position of the horizontal direction and the corresponding grating sheets is 0.00012 mm, while an alignment error between the pixels at two edges of the central position of the horizontal direction and the corresponding grating sheets will be larger, for example, the alignment error between the $n^{th}$ grating sheet and the corresponding pixel is n×0.00012 mm, while the alignment error between the pixels at the outermost edge and the corresponding grating sheets is 200×0.00012 mm=0.024 mm. A proportion of the alignment error in one pixel region of the display panel is 0.024÷0.111×100%=22%, thus a serious crosstalk can be caused, and a viewing angle and a brightness uniformity of stereoscopic display are reduced, and a viewing effect of stereoscopic display is seriously affected.

SUMMARY

Embodiments of the present invention provide a parallax barrier, a designing method thereof and a parallax barrier type 3D display device, wherein a difference between the average value $C_{average}$ of the grating pitches of each grating section of the parallax barrier and the theoretical value $C_{theory}$ of the grating pitch is smaller than a difference between a practical fabrication accuracy and the $C_{theory}$; an alignment error between the parallax barrier and a display panel of the parallax barrier type 3D display device is reduced, and thus, a crosstalk caused by the alignment error is reduced, and a viewing angle, a brightness uniformity and a viewing effect of stereoscopic display are improved.

An embodiment of the present invention provides a parallax barrier, comprising: a plurality of grating sheets, utilized to shield light, disposed in an arrangement direction and spaced apart from each other, wherein the plurality of grating sheets are divided into 2K identical grating sections each of which comprises two or more grating segments, each grating segment comprises one or more grating sheets with an identical grating pitch C, and the grating sheets included in different grating segments have different grating pitches, and the 2K grating sections are arranged symmetrically about a center line of the parallax barrier in the arrangement direction, and K is a natural number.

An embodiment of the present invention also provides a designing method of the above parallax barrier, comprising following steps: determining the number N of the grating sheets of the parallax barrier according to the requirements of the parallax barrier; obtaining a theoretical value $C_{theory}$ of a grating pitch by calculation; determining the grating pitches $C_1, C_2, C_3, \ldots C_{(i-1)}$, and $C_i$ of each of the grating segments according to the requirements of the parallax barrier and the minimum practical fabrication accuracy; assigning an initial value to K so that K=1; performing a calculation according to formulas $C_{average1}=(n_1\times C_1+n_2\times C_2)\div(n_1+n_2)=C_{theory}$, $C_{average2}=(n_2\times C_2+n_3\times C_3)\div(n_2+n_3)=C_{theory}$ . . . $C_{average(i-1)}=(n_{(i-1)}\times C_{(i-1)}+n_i\times C_i)\div(n_{(i-1)}+n_i)=C_{theory}$ and K=N÷2÷$(n_1+n_2+n_3+\ldots+n_i)$ to obtain $n_1, n_2, \ldots, n_i$ through rounding, wherein, $n_1, n_2, \ldots, n_i$ are respectively the numbers of the grating sheets included in the grating segments with grating pitches of $C_1, C_2, C_3, \ldots, C_{(i-1)}$ and $C_i$, and i is a natural number larger than or equal to 1.

An embodiment of the present invention also provides a parallax barrier type 3D display device, comprising: a display panel; and a parallax barrier as described above which is parallel to the display panel, wherein, the center line of the parallax barrier aligns with a center line of the display panel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
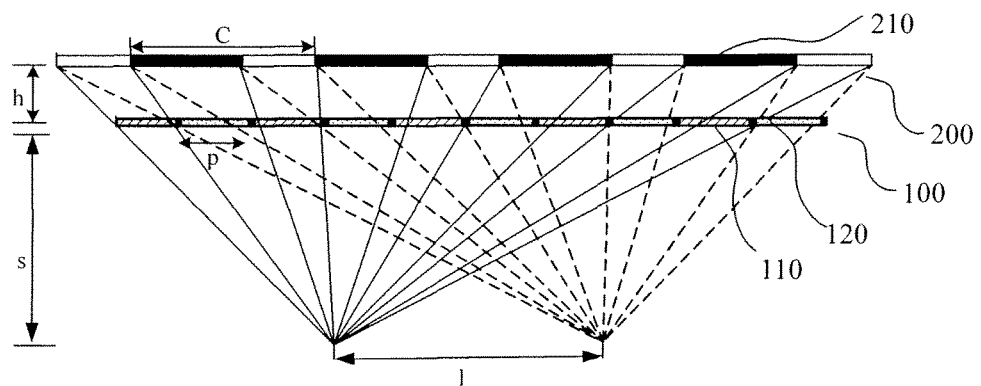
FIG. 1 is a principle view of the light path of a current two-viewpoint rear parallax barrier 3D display device.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A design principle and a design procedure of a parallax barrier and a parallax barrier type 3D display device according to the embodiments of the present invention are as follow:

The parallax barrier type 3D display device according to the embodiment of the present invention comprises: a display panel; and a parallax barrier, which is parallel to the display panel, wherein, a center line of the parallax barrier aligns with a center line of the display panel a display panel; wherein, the center line of the parallax barrier is a midline of a region between the outermost sides of two grating sheets at the outermost edges of the parallax barrier, and the center line of the display panel is a midline of the display panel in an arrangement direction of the grating sheets in the parallax barrier; wherein the parallax barrier comprises: the plurality of grating sheets, utilized to shield light, disposed in the arrangement direction and spaced apart from each other, and the plurality of grating sheets are divided into 2K identical grating sections each of which comprises two or more grating segments, each grating segment comprises one or more grating sheets with an identical grating pitch C, and the grating sheets included in different grating segments have different grating pitches, and the 2K grating sections are arranged symmetrically about the center line of the parallax barrier in the arrangement direction, and K is a natural number.

Herein, each grating section comprises i grating segments, which are respectively a first grating segment comprising $n_1$ grating sheets with a grating pitch of $C_1$, a second grating segment comprising $n_2$ grating sheets with a grating pitch of $C_2$, a third grating segment comprising $n_3$ grating sheets with a grating pitch of $C_3, \ldots$, a $(i-1)^{th}$ grating segment comprising $n_{(i-1)}$ grating sheets with a grating pitch of $C_{(i-1)}$, an $i^{th}$ grating segment comprising $n_i$ grating sheets with a grating pitch of $C_i$, sequentially provided in a direction from the center line of the parallax barrier towards one edge of the parallax barrier; and the i grating segments meet the following formulas: the average value of the grating pitches of the first grating segment and the second grating segment $C_{average1}=(n_1\times C_1+n_2\times C_2)\div(n_1+n_2)=C_{theory}$; the average value of the grating pitches of the second grating segment and the third grating segment $C_{average2}=(n_2\times C_2+n_3\times C_3)\div$ $(n_2+n_3)=C_{theory}$; ... the average value of the grating pitches of the $(i-1)^{th}$ grating segment and the $i^{th}$ grating segment $C_{average(i-1)}=(n_{(i-1)} \times C_{(i-1)}+n_i \times C_i) \div (n_{(i-1)}+n_i)=C_{theory}$; $K=N \div 2 \div (n_1+n_2+n_3+ \ldots +n_i)$; wherein, K is a natural number, i is a natural number larger than or equal to 2, the grating sheet is a black stripe having the light-shielding effect in the parallax barrier, the grating segment is a segment of the parallax barrier with the same grating pitch in the grating section, the grating pitch is represented with C, the grating section is a maximum repeated unit in the parallax barrier and comprises two or more grating segments; and $C_{theory}$ is theoretically calculated according to a structure model of the parallax barrier.

Herein, it should be noted that the arrangement direction of the grating sheets is the same with the length direction of the display panel.

The number N of the grating sheets of the parallax barrier meets a formula: $N=2 \times K \times (n_1+n_2+n_3+ \ldots +n_i)$.

The design procedure of the parallax barrier according to the embodiment of the present invention is as follow: firstly, determining the number N of the grating sheets of the parallax barrier according to requirements of the parallax barrier, determining $C_1, C_2, C_3, \ldots, C_{(i-1)}$, and $C_i$ according to the requirements of the parallax barrier and the minimum practical fabrication accuracy, and then, under a condition that N, $C_1, C_2, C_3, \ldots C_{(i-1)}$ and $C_{theory}$ are determined, assigned an initial value to K so that K=1, and then, calculating $n_1, n_2, n_3, \ldots, n_{(i-1)}, n_i$ according to formulas: $C_{average1}=(n_1 \times C_1+n_2 \times C_2) \div (n_1+n_2)=C_{theory}$, $C_{average2}=(n_2 \times C_2+n_3 \times C_3) \div (n_2+n_3)=C_{theory} \ldots C_{average(i-1)}=(n_{(i-1)} \times C_{(i-1)}+n_i \times C_i) \div (n_{(i-1)}+n_i) C_{theory}$ and $K=N \div 2 \div (n_1+n_2+n_3+ \ldots +n_i)$.

Due to the above condition of $C_{average1}=C_{average2}=C_{average3}= \ldots =C_{average(i-1)}=C_{averagei}=C_{theory}$, that is, the average value of the grating pitch of each grating section $C_{average}=(n_1 \times C_1+n_2 \times C_2+ \ldots +n_i \times C_i) \div (n_1+n_2+ \ldots +n_i)=C_{theory}$, an error between the average value $C_{average}$ of the grating pitch of each grating section and the theoretical value $C_{theory}$ of the grating pitch is zero, thus the alignment error between the parallax barrier so designed and the display panel is relatively small.

In addition, it should be noted that the above arrangement order of the plurality of grating segments in each grating section is only an example; in fact, the arrangement order of the plurality of grating segments in each grating section does not affect the average value $C_{average}$ of the grating pitch of each grating section, thus positions of the plurality of grating segments in each grating section can be changed.

Exemplarily, if not all of the $n_1, n_2, \ldots, n_i$ calculated in the above design procedure are natural numbers, the $n_1, n_2, \ldots, n_i$ can be rounded to obtain natural numbers, and then the natural numbers so obtained are reassigned to the $n_1, n_2, \ldots, n_i$.

Exemplarily, if all of the $n_1, n_2, \ldots, n_i$ obtained in the above design procedure are natural numbers, one repeated grating section is arranged from the center line of the parallax barrier towards one edge of the parallax barrier, and the grating section comprises i grating segments, which are respectively a first grating segment comprising $n_1$ grating sheets with a grating pitch of $C_1$, a second grating segment comprising $n_2$ grating sheets with a grating pitch of $C_2, \ldots$, an $i^{th}$ grating segment comprising $n_i$ grating sheets with a grating pitch of $C_i$, sequentially provided in a direction from the center line of the parallax barrier towards one edge of the parallax barrier.

Because the error between the average value $C_{average}$ of the grating pitch of each grating section and the theoretical value $C_{theory}$ of the grating pitch is very small, herein the error is defined to be X, that is, X is very small, the alignment error between the parallax barrier and the display panel of the parallax barrier type 3D display device is small, thus, the crosstalk caused by the alignment error is reduced, and the viewing angle and brightness uniformity of stereoscopic display are enhanced, and the viewing effect of stereoscopic display is improved.

However, under a condition of K=1, one grating section is provided at each of two sides of the center line of the parallax barrier respectively, and each grating section comprises i grating segments with different grating pitches, and thus, a relatively high processing requirement is required for the parallax barrier and the processing efficiency of the parallax barrier is reduced, and in order to lower the processing requirements for the parallax barrier, the above design procedure can be further optimized.

Exemplarily, if a difference between any two of $n_1, n_2, \ldots, n_i$ is relatively small, for example, less than 10, values are reassigned to $n_1, n_2, \ldots, n_i$, so that $n_1=n_2= \ldots =n_i=1$, and after calculating using a formula $K=N \div 2 \div (n_1+n_2+n_3+ \ldots +n_i)$, $K=N \div 2 \div i$ is obtained. The optimized parallax barrier comprises K repeated grating sections arranged from the center line of the parallax barrier towards one edge of the parallax barrier, and the grating sections comprise i grating segments, which are respectively a first grating segment comprising one grating sheet with a grating pitch of $C_1$, a second grating segment comprising one grating sheet with a grating pitch of $C_2, \ldots$, an $i^{th}$ grating segment comprising one grating sheet with a grating pitch of $C_1$, sequentially provided in a direction from the center line of the parallax barrier towards one edge of the parallax barrier.

Thus, the optimized parallax barrier comprises as many repeated grating sections as possible, compared with the parallax barrier before the optimization comprising one grating section, the processing requirement for the parallax barrier is lowered; meanwhile, the alignment error between the optimized parallax barrier and the display panel is relatively small, then the crosstalk due to the alignment error is reduced, the viewing angle and brightness uniformity of stereoscopic display are enhanced, and the viewing effect of stereoscopic display is improved.

Exemplarily, if a difference between any two of $n_1, n_2, \ldots, n_i$ is relatively large, for example, larger than or equal to 10, then $n_1$ is added and subtracted with a certain natural number, for example, 8; the same adding or subtracting operation is conducted to $n_2$, for example, $n_2$ is added and subtracted with 8; ...; the same adding and subtracting operation is conducted to $n_i$, for example, $n_i$ is added and subtracted with 8, then a operation of seeking the greatest common divisor is conducted to the $n_1, n_2, \ldots, n_i$ obtained after the adding and subtracting to obtain a greatest common divisor A; then, A is assigned to K so that K=A, and the value obtained by calculating using $n_1 \div A$ is rounded and then assigned to $n_1$, the value obtained by calculating using $n_2 \div A$ is rounded and then assigned to $n_2, \ldots$, and the value obtained by calculating using $n_i \div A$ is rounded and then assigned to $n_i$, thereby obtaining new $n_1, n_2, \ldots, n_i$ which are coprime numbers. Therefore, the optimized parallax barrier comprises K=A repeated grating sections arranged from the center line of the parallax barrier towards one edge of the parallax barrier, and the grating sections comprise i grating segments, which are respectively a first grating segment comprising $n_1$ grating sheets with a grating pitch of $C_1$, a second grating segment comprising $n_2$ grating sheets with a grating pitch of $C_2, \ldots$, an $i^{th}$ grating segment comprising $n_i$ grating sheets with a grating pitch of $C_i$, sequentially provided in a direction from the center line of the parallax barrier towards one edge of the parallax barrier.

Thus, the optimized parallax barrier comprises as many repeated grating sections as possible, compared with the parallax barrier before the optimization comprising one grating section, the processing requirement for the parallax barrier is lowered; meanwhile, the alignment error between the optimized parallax barrier and the display panel is relatively small, then the crosstalk due to the alignment error is reduced, the viewing angle and brightness uniformity of stereoscopic display are enhanced, and the viewing effect of stereoscopic display is improved.

Figure 3:
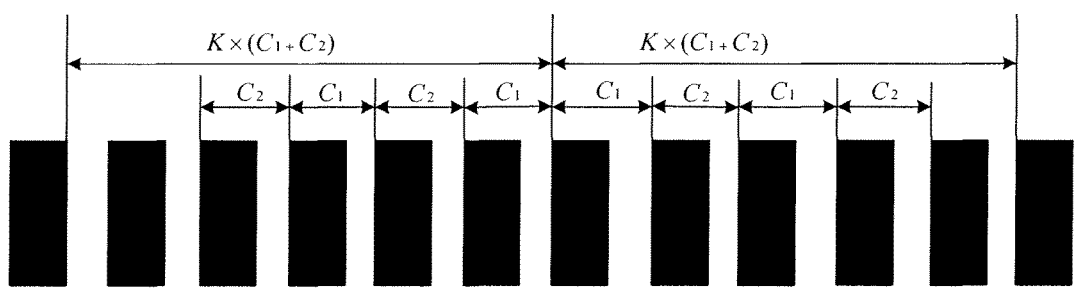
FIG. 3 is a schematic view of a parallax barrier according to an embodiment of the present invention.

A design of the parallax barrier applied to the parallax barrier type 3D display device according to the embodiment of the present invention will be described hereinafter with reference to a specific example. The design of a two-viewpoint rear parallax barrier applied to a 4-inch parallax barrier type 3D display device will be taken as an example, and the theoretical value $C_{theory}$ of the grating pitch of the two-viewpoint rear parallax barrier satisfies: $C_{theory}=2 \times p \times l \div (l-p)$, l is a distance between two eyes, p is a pixel length of the display panel in an arrangement direction of grating sheets of the parallax barrier, i.e., in a length direction of the display panel, when the pixel length p of the display panel in the length direction of the display panel is 0.111 mm, a best viewing distance s is 300 mm and the distance l between two eyes is 65 mm, it can be calculated that $C_{theory}=0.22238$ mm, suppose that a practical fabrication accuracy is 0.00025 mm, and, it is determined according to requirements for the parallax barrier that i=2, it is determined according to requirements for the parallax barrier that N=400, it is determined according to requirements for the parallax barrier and a minimum practical fabrication accuracy that $C_1=0.2225$ mm and $C_2=0.22225$ mm, then an initial value is assigned to K so that K=1, and thus, on the basis of the above conditions, it can be obtained that $n_1=104$ and $n_2=96$ according to formulas of $n_1 \times 0.2225 + n_2 \times 0.22225 = 200 \times 0.22238$ and $2 \times 1 \times (n_1 + n_2) = 400$, and because a difference between $n_1$ and $n_2$ is relatively small, values are reassigned to $n_1$ and $n_2$ so that $n_1 = n_2 = 1$, and then it is calculated that $K=400 \div 2 \div 2 = 100$. The parallax barrier shown in FIG. 3 is obtained after the above design, as shown in FIG. 3, parameters of the optimized parallax barrier are: $n_1=n_2=1$, K=100, $C_1=0.2225$ mm, $C_2=0.22225$ mm and $C_{average}=(1 \times C_1 + 1 \times C_2) \div (1+1) = 0.222375$ mm, and X=0.000005 mm and Y=0.00013 mm, and X is the error between the average value $C_{average}$ of the grating pitch of each grating section and the theoretical value $C_{theory}$ of the grating pitch, Y is practical fabrication accuracy of a parallax barrier–$2 \times p - p \div (l-p)$, thus, $X/Y = 0.000005 \div 0.00013 \times 100\% = 3.846\%$, that is, X is 3.846% of Y.

Figure 4:
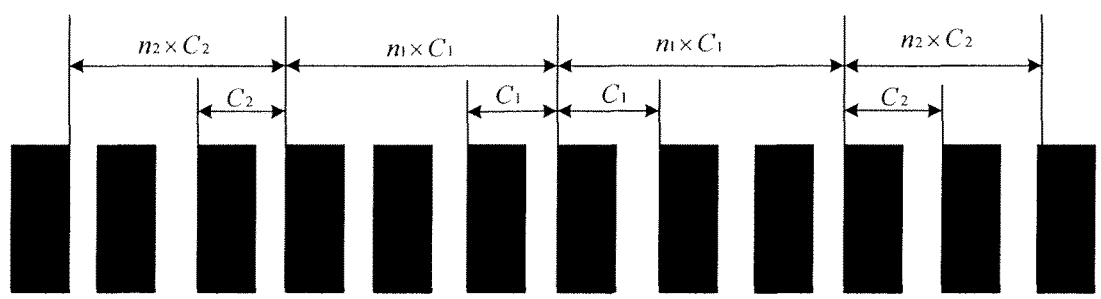
FIG. 4 is a schematic view of a parallax barrier according to another embodiment of the present invention.

Exemplarily, if the difference between the obtained $n_1$ and $n_2$ is relatively large, for example, $n_1=117$ and $n_2=83$, then $n_1$ is added and subtracted with a certain natural number, for example, 117 is added and subtracted with 3, likewise, $n_2$ is added and subtracted with a certain natural number, for example, 83 is added and subtracted with 3, then a operation of seeking the greatest common divisor A is conducted, the greatest common divisor A of 120 and 80 is 40, and then A is assigned to K so that K=A=40, the value obtained by calculating using $117 \div 40$ is rounded and then assigned to $n_1$ so that $n_1=3$, and the value obtained by calculating using $83 \div 40$ is rounded and then assigned to $n_2$ so that $n_2=2$, and thus the parallax barrier shown in FIG. 4 is obtained, as shown in FIG. 4, parameters of the optimized parallax barrier are: $n_1=3$, $n_2=2$, K=40, $C_1=0.22225$ mm, $C_2=0.2225$ mm, X=0.00003 mm, and Y=0.00013 mm, $X/Y=0.00003 \div 0.00013 \times 100\% = 23.077\%$, that is, X is 23.007% of Y.

The parallax barrier according to the first embodiment of the present invention is obtained by using the above designing method, in which K repeated grating sections are arranged from the center line of the parallax barrier towards each of two edges of the parallax barrier, and each of the grating sections comprises two or more grating segments, and X<Y, X is a difference between the average value $C_{average}$ of the grating pitch of each grating section and the theoretical value $C_{theory}$ of the grating pitch, and Y is a difference between the practical fabrication accuracy of the parallax barrier and the $C_{theory}$. Wherein, K is a natural number, the grating segment is a segment of the parallax barrier with the same grating pitch in the grating section, the grating pitch is represented with C, the grating section is a maximum repeated unit in the parallax barrier and comprises two or more grating segments; and the $C_{theory}$ is a parameter value theoretically calculated according to a structure model of the parallax barrier.

Figure 2:
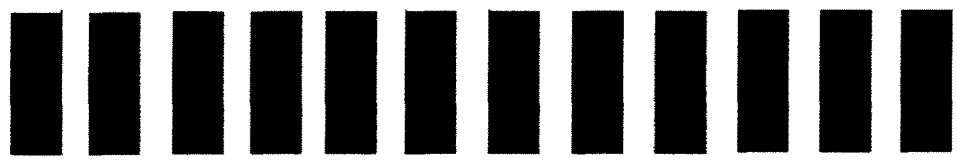
FIG. 2 is a schematic view of a conventional parallax barrier.

As shown in FIG. 2, the grating pitches of a conventional parallax barrier are the same, for the conventional parallax barrier, X=Y, the larger the number of grating sheets of the parallax barrier is, the larger the alignment error at two edges of the parallax barrier is. For the parallax barrier according to the present embodiment, X is smaller than Y, that is, the difference between the average value $C_{average}$ of the grating pitch of each grating section of the parallax barrier and the theoretical value $C_{theory}$ of grating pitch is smaller than the difference between the practical fabrication accuracy of the parallax barrier and the $C_{theory}$. Thus, the alignment error between the parallax barrier and the display panel is reduced, the crosstalk caused by the alignment error is lowered, and the viewing angle and brightness uniformity of stereoscopic display are enhanced and the viewing effect of stereoscopic display is improved.

For a parallax barrier according to a second embodiment of the present invention, based on the first embodiment, X and Y are defined so that X is 0%-50% of Y.

In the present embodiment, X is 0%-50% of Y, and compared with a conventional parallax barrier, the error between the average value $C_{average}$ of the grating pitch of each grating section and the theoretical value $C_{theory}$ of the grating pitch is greatly reduced, and in turn, the alignment error between the parallax barrier and the display panel is reduced, the crosstalk caused by the alignment error is greatly lowered, the viewing angle and brightness uniformity of stereoscopic display are enhanced and the viewing effect of stereoscopic display is improved.

For a parallax barrier according to a third embodiment of the present invention, based on the first embodiment and the second embodiment, each grating section is further defined.

Each grating section comprises i grating segments, which are respectively a first grating segment comprising $n_1$ grating sheets with a grating pitch of $C_1$, a second grating segment comprising $n_2$ grating sheets with a grating pitch of $C_2$, . . . , an $i^{th}$ grating segment comprising $n_i$ grating sheets with a grating pitch of $C_i$, wherein, i is a natural number larger than or equal to 2, $n_1, n_2, \ldots, n_i$ are natural numbers; $C_1, C_2, \ldots, C_i$ are relevant to the practical fabrication accuracy of the parallax barrier, and the grating sheet is a black stripe in the parallax barrier which serve to shield light.

An arrangement order of the plurality of grating segments in each grating section does not affect the average value $C_{average}$ of the grating pitch of each grating section, thus positions of the plurality of grating segments in each grating section can be changed.

For a parallax barrier according to a fourth embodiment of the present invention, based on the third embodiment, $n_1, n_2, n_3, \ldots, n_i$ are further defined.

$n_1, n_2, n_3, \ldots, n_i$ are coprime numbers, and $K=N\div 2\div(n_1+n_2+\ldots+n_i)$; wherein, N is the number of the grating sheets of the parallax barrier.

$n_1, n_2, n_3, \ldots, n_i$ are coprime numbers, that is, the parallax barrier in this embodiment comprises as many repeated grating sections as possible, and compared with the parallax barrier comprising only one grating section, the processing requirement for the parallax barrier is lowered.

For a parallax barrier according to a fifth embodiment of the present invention, based on the third embodiment, i and $n_1, n_2, n_3, \ldots, n_i$ are further defined.

$i=2$ and $n_1$ and $n_2$ are coprime numbers, and $K=N\div 2\div(n_1+n_2)$ wherein, N is the number of the grating sheets of the parallax barrier.

$i=2$ and $n_1$ and $n_2$ are coprime numbers, that is, the parallax barrier in this embodiment comprises as many repeated grating sections as possible while types of the grating segments included in each grating section are fewer, compared with a parallax barrier in which each grating section comprises three or more grating segments, the processing requirement for the parallax barrier is lowered.

For a parallax barrier according to a sixth embodiment of the present invention, based on the third embodiment, $n_1, n_2, n_3, \ldots, n_i$ are further defined.

$n_1=n_2=n_3=\ldots=n_i=1$ and $K=N\div 2\div i$, wherein, N is the number of the grating sheets of the parallax barrier.

$n_1=n_2=n_3=\ldots=n_i=1$, that is, the numbers of the grating sheets in each of the plurality of grating segments of each grating section of the parallax barrier in this embodiment are 1, meeting that $n_1, n_2, n_3, \ldots, n_i$ are coprime numbers, and also, the parallax barrier in this embodiment comprises as many repeated grating sections as possible, and the number of the grating sheet of each grating segment is 1, and then the processing requirement is lowered.

For a parallax barrier according to a seventh embodiment of the third embodiment, and i and $n_1, n_2, n_3, \ldots, n_i$ are further defined.

$i=2$ and $n_1=n_2=1$, and $K=N\div 4$, wherein, N is the number of the grating sheets of the parallax barrier.

$i=2$ and $n_1=n_2=1$, that is, the numbers of the grating sheets in each of the plurality of grating segments of each grating section of the parallax barrier in this embodiment are 1, meeting that $n_1$ and $n_2$ are coprime numbers, the parallax barrier comprises as many repeated grating sections as possible while types of the grating segments included in each grating section are fewer, compared with a parallax barrier in which each grating section comprises three or more grating segments, the processing requirement for the parallax barrier is lowered.

For a parallax barrier according to a eighth embodiment of the present invention, based on the first embodiment and the second embodiment, the grating section is further defined.

Each grating section comprises i grating segments, which are respectively a first grating segment comprising $n_1$ grating sheets with a grating pitch of $C_1$, a second grating segment comprising $n_2$ grating sheets with a grating pitch of $C_2$, a third grating segment comprising $n_3$ grating sheets with a grating pitch of $C_3, \ldots$, a $(i-1)^{th}$ grating segment comprising $n_{(i-1)}$ grating sheets with a grating pitch of $C_{(i-1)}$, and an $i^{th}$ grating segment comprising $n_i$ grating sheets with a grating pitch of $C_i$, sequentially provided in a direction from the center line of the parallax barrier towards one edge of the parallax barrier, and the i grating segments meet the following formulas:

the average value of the grating pitches of the first grating segment and the second grating segment $C_{average1}=(n_1\times C_1+n_2\times C_2)\div(n_1+n_2)=C_{theory}$;

the average value of the grating pitches of the second grating segment and the third grating segment $C_{average2}=(n_2\times C_2+n_3\times C_3)\div(n_2+n_3)=C_{theory}$;

...

the average value of the grating pitches of the $(i-1)^{th}$ grating segment and the $i^{th}$ grating segment $C_{average(i-1)}=(n_{(i-1)}\times C_{(i-1)}+n_i\times C_i)\div(n_{(i-1)}+n_i)=C_{theory}$;

$K=N\div 2\div(n_1+n_2+n_3+\ldots+n_i)$;

Wherein, i is a natural number larger than or equal to 2, $n_1, n_2, n_3, \ldots, n_i$ are natural numbers; $C_1, C_2, C_3, \ldots, C_{(i-1)}$, $C_i$ are relevant to the practical fabrication accuracy of the parallax barrier, and the grating sheet is a black stripe in the parallax barrier which serve to shield light.

In this embodiment, an error between the average value $C_{average}$ of the grating pitches of each grating section and the theoretical value $C_{theory}$ of the grating pitch is zero, thus an alignment error between of the parallax barrier and the display panel is relatively small.

A ninth embodiment of the present invention provides a parallax barrier type 3D display device, comprising: a display panel; and a parallax barrier which is arranged parallel to the display panel, and the parallax barrier is any of the above parallax barriers, and the center line of the parallax barrier aligns with a center line of the display panel; wherein, the center line of the parallax barrier is a midline of a region between the outermost sides of two grating sheets at the outermost edges of the parallax barrier, and the center line of the display panel is a midline of the display panel in an arrangement direction of grating sheets in the parallax barrier. The parallax barrier type 3D display device according to the embodiment of the present invention reduces an alignment error between the parallax barrier and the display panel, lowers the crosstalk caused by the alignment error, and improves the viewing angle and brightness uniformity of stereoscopic display and the viewing effect of stereoscopic display.

For the parallax barrier and the parallax barrier type 3D display device provided by the embodiments of the present invention, the difference between the average value $C_{average}$ of the grating pitches of each grating section of the parallax barrier and the theoretical value $C_{theory}$ of the grating pitch is smaller than the difference between the practical fabrication accuracy of the parallax barrier and the theory $C_{theory}$; and the parallax barrier type 3D display device reduces the alignment error between the parallax barrier and the display panel, lowers the crosstalk caused by the alignment error, and improves the viewing angle and brightness uniformity of stereoscopic display and the viewing effect of stereoscopic display.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A parallax barrier, comprising:
a plurality of grating sheets, utilized to shield light, disposed in an arrangement direction and spaced apart from each other,
wherein the plurality of grating sheets are divided into 2K grating sections each of which comprises two or more grating segments, each grating segment comprises one or more grating sheets with an identical grating pitch C, and in each grating section, the grating sheets included in different grating segments have different grating pitches, any two grating sections of the 2K grating sections comprises a same number of the grating segments and the grating pitches C of the grating segments comprised in one of the any two grating sections and the grating pitches C of the grating segments comprised in another of the any two grating sections are in a one-to-one corresponding relationship, the grating segments with the same grating pitch comprises the same number of grating sheets, and each of the grating sections comprises i grating segments, which are respectively a first grating segment comprising $n_1$ grating sheets with a grating pitch of $C_1$, a second grating segment comprising $n_2$ grating sheets with a grating pitch of $C_2$, . . . an $i^{th}$ grating segment comprising $n_i$ grating sheets with a grating pitch of $C_i$, wherein K is a natural number assigned according to an equation of $K=N\div 2\div (n_1+n_2+\ldots +n_i)$ to allow $n_1, n_2, \ldots n_i$ to be coprime numbers, where i is a natural number larger than or equal to 2, $C_1, C_2, \ldots, C_i$ are relevant to a practical fabrication accuracy of the parallax barrier, N is the number of the grating sheets of the parallax barrier, and
arrangement orders of the grating segments in different grating sections are different along the arrangement direction.

2. The parallax barrier according to claim 1, wherein, X is defined to be a difference between an average value $C_{average}$ of the grating pitches of each grating section and a theoretical value $C_{theory}$ of the grating pitch, Y is defined to be a difference between a practical fabrication accuracy and the $C_{theory}$, X<Y, and $C_{theory}$ is theoretically calculated according to a structure model of the parallax barrier.

3. The parallax barrier according to claim 2, wherein, X is 0%-50% of Y.

4. The parallax barrier according to claim 1, wherein, i=2 and $n_1$ and $n_2$ are coprime numbers, $K=N\div 2\div (m+n_2)$, herein, N is the number of the grating sheets of the parallax barrier.

5. The parallax barrier according to claim 1, wherein, $n_1=n_2=\ldots =n_i=1$, $K=N\div 2\div i$, herein, N is the number of the grating sheets of the parallax barrier.

6. The parallax barrier according to claim 1, wherein, i=2 and $n_1=n_2=1$, $K=N\div 4$, herein, N is the number of the grating sheets of the parallax barrier.

7. The parallax barrier according to claim 1, wherein, each grating section comprises i grating segments, which are respectively a first grating segment comprising $n_1$ grating sheets with a grating pitch of $C_1$, a second grating segment comprising $n_2$ grating sheets with a grating pitch of $C_2$, a $(i-1)^{th}$ grating segment comprising $n_{(i-1)}$ grating sheets with a grating pitch of $C_{(i-1)}$, an $i^{th}$ grating segment comprising $n_i$ grating sheets with a grating pitch of $C_i$, sequentially provided in a direction from the center line of the parallax barrier towards one edge of the parallax barrier; and the i grating segments meet the following formulas:
the average value of the grating pitches of the first grating segment and the second grating segment $C_{average1}=(n_1\times C_1+n_2\times C_2)\div (n_1+n_2)=C_{theory}$;
. . .
the average value of the grating pitches of the $(i-1)^{th}$ grating segment and the $i^{th}$ grating segment $C_{average(i-1)}=(n_{(i-1)}\times C_{(i-1)}+n_i\times C_i)\div (n_{(i-1)}+n_i)=C_{theory}$; $K=N\div 2\div (n_1+n_2+n_3+\ldots +n_i)$;
wherein, i is a natural number larger than or equal to 2, $n_1, n_2, \ldots, n_i$ are natural numbers; and $C_1, C_2, \ldots, C_i$ are relevant to the practical fabrication accuracy of the parallax barrier.

8. A designing method of the parallax barrier according to claim 1, comprising following steps:
determining the number N of the grating sheets of the parallax barrier according to requirements for the parallax barrier;
obtaining a theoretical value $C_{theory}$ of a grating pitch by calculation;
determining the grating pitches $C_1, C_2, \ldots C_{(i-1)}$, and $C_i$ of each of the grating segments according to the requirements for the parallax barrier and the minimum practical fabrication accuracy;
assigning an initial value to K so that K=1;
performing a calculation according to formulas $C_{average1}=(n_1\times C_1+n_2\times C_2)\div (n_1+n_2)=C_{theory}, \ldots, C_{average(i-1)}=(n_{(i-1)}\times C_{(i-1)}+n_i\times C_i)\div (n_{(i-1)}+n_i)=C_{theory}$ and $K=N\div 2\div (n_1+n_2+n_3+\ldots +n_i)$ to obtain $n_1, n_2, \ldots, n_i$ through rounding, wherein, $n_1, n_2, \ldots, n_i$ are respectively the numbers of the grating sheets included in the grating segments with grating pitches of $C_1, C_2, \ldots C_{(i-1)}$ and $C_i$, and i is a natural number larger than or equal to 2.

9. The designing method according to claim 8, wherein, if the difference between any two of $n_1, n_2, \ldots, n_i$ is less than 10, values are assigned to $n_1, n_2, \ldots, n_i$ again, so that $n_1=n_2=\ldots =n_i=1$, and after calculating using a formula $K=N\div 2\div (n_1+n_2+n_3+\ldots +n_i)$, $K=N\div 2\div i$ is obtained.

10. The designing method according to claim 8, wherein, if the difference between any two of $n_1, n_2, \ldots, n_i$ is larger than or equal to 10, $n_1, n_2, \ldots, n_i$ are added or subtracted with the same natural number at the same time, until a greatest common divisor A is found, then assigning A to K so that K=A, and a value obtained by calculating using $n_1\div A$ is rounded and then assigned to $n_1$, a value obtained by calculating using $n_2\div A$ is rounded and then assigned to $n_2, \ldots$, and a value obtained by calculating using $n_i\div A$ is rounded and then assigned to $n_i$, thereby obtaining new $n_1, n_2, \ldots, n_i$.

11. A parallax barrier type 3D display device, comprising:
a display panel; and
a parallax barrier according to claim 1, which is parallel to the display panel,
wherein, a center line of the parallax barrier aligns with a center line of the display panel.

12. The parallax barrier type 3D display device according to claim 11, wherein, the parallax barrier is arranged at a light-emitting side or a light incident side of the display panel.

* * * * *